US005902780A

United States Patent [19]
Lee

[11] Patent Number: 5,902,780
[45] Date of Patent: *May 11, 1999

[54] CLEANING COMPOSITIONS FOR REMOVING ETCHING RESIDUE AND METHOD OF USING

[75] Inventor: Wai Mun Lee, Fremont, Calif.

[73] Assignee: EKC Technology, Inc., Hayward, Calif.

[*] Notice: This patent is subject to a terminal disclaimer.

[21] Appl. No.: 08/790,229

[22] Filed: Jan. 28, 1997

Related U.S. Application Data

[62] Division of application No. 08/523,889, Sep. 6, 1995, Pat. No. 5,672,577, which is a continuation of application No. 08/273,143, Jul. 14, 1994, Pat. No. 5,482,566, which is a division of application No. 07/911,102, Jul. 9, 1992, Pat. No. 5,334,332, which is a continuation-in-part of application No. 07/610,044, Nov. 5, 1990, Pat. No. 5,279,771.

[51] Int. Cl.$^6$ .............................. C11D 3/20; C11D 3/26; C11D 3/30

[52] U.S. Cl. ............................. 510/176; 134/2; 134/38; 134/40; 510/108; 510/175; 510/245; 510/254; 510/401; 510/402; 510/405; 510/434; 510/489; 510/492; 510/499; 510/505

[58] Field of Search ................. 510/176, 405, 510/499, 401, 402, 175, 108, 245, 254, 434, 489, 492, 505; 134/38, 40, 2

[56] References Cited

U.S. PATENT DOCUMENTS

| Re. 30,714 | 8/1981 | Harriman et al. | 134/2 |
| Re. 30,796 | 11/1981 | Lesinski | 134/2 |
| 3,160,539 | 12/1964 | Hall et al. | 156/17 |
| 3,530,186 | 9/1970 | Greco | 260/571 |
| 3,582,401 | 6/1971 | Berilla et al. | 134/3 |

(List continued on next page.)

FOREIGN PATENT DOCUMENTS

| 55-52379 | 4/1980 | Japan. |
| 56-5899 | 1/1981 | Japan. |
| 62-49355 | 3/1987 | Japan. |
| 62-95531 | 5/1987 | Japan. |
| 63-183445 | 7/1988 | Japan. |
| 64-21088 | 1/1989 | Japan. |
| 1-105949 | 4/1989 | Japan. |
| 1-159388 | 6/1989 | Japan. |
| 5-259066 | 10/1993 | Japan. |
| 1144481 | 5/1969 | United Kingdom. |
| 2157670 | 10/1985 | United Kingdom. |

OTHER PUBLICATIONS

Material Safety Data Sheet, Experimental Stripper, WMX–225 (1 sheet).
Material Safety Data Sheet, Experimental Stripper, WMX–230 (1 sheet).
"Reactions of Catechol", Crown Zellerbach Corp., Chemicals Products Division, Camas, Washington 98607 (Pp. 1–33 w/Cover Sheet and Table of Contents).
Concise Science Dictionary, Oxford University Press, pp. 649, 739, 740, 1984 Month not known.

*Primary Examiner*—Paul Lieberman
*Assistant Examiner*—Gregory R. Delcotto
*Attorney, Agent, or Firm*—Pennie & Edmonds LLP

[57] ABSTRACT

A stripping and cleaning composition for removing resists and etching residue from substrates containing hydroxylamine and at least one alkanolamine is described. Further, a cleaning composition for removing etching residue from semiconductor substrates containing hydroxylamine, at least one alkanolamine, at least one chelating agent, and water is described. The preferred chelating agent is 1,2-dihydroxybenzene or a derivative thereof. The chelating agent provides added stability and effectiveness to the cleaning composition.

6 Claims, 9 Drawing Sheets

U.S. PATENT DOCUMENTS

| | | | |
|---|---|---|---|
| 3,649,395 | 3/1972 | Lee | 156/16 |
| 3,753,933 | 8/1973 | Olstowski et al. | 260/2.5 X |
| 3,972,839 | 8/1976 | Murphy | 252/548 |
| 4,067,690 | 1/1978 | Cuisia et al. | 422/16 |
| 4,111,767 | 9/1978 | Kawagishi et al. | 204/146 |
| 4,155,866 | 5/1979 | Berkenblit et al. | 252/79.1 |
| 4,165,294 | 8/1979 | Vander Mey | 134/42 X |
| 4,187,140 | 2/1980 | Berkenblit et al. | 156/662 |
| 4,221,674 | 9/1980 | Vander Mey | 134/42 X |
| 4,238,275 | 12/1980 | Shih | 156/626 |
| 4,264,716 | 4/1981 | Vincent et al. | 430/380 |
| 4,268,406 | 5/1981 | O'Brien et al. | 252/105 |
| 4,276,185 | 6/1981 | Martin . | |
| 4,278,635 | 7/1981 | Kerst | 422/14 |
| 4,279,870 | 7/1981 | Natansohn et al. | 423/54 |
| 4,282,111 | 8/1981 | Ciuba | 210/749 X |
| 4,284,435 | 8/1981 | Fox | 134/2 |
| 4,289,645 | 9/1981 | Muccitelli | 422/18 X |
| 4,350,606 | 9/1982 | Cuisia et al. | 252/392 |
| 4,425,380 | 1/1984 | Nuzzi et al. | 134/29 X |
| 4,482,626 | 11/1984 | Twist et al. | 430/380 |
| 4,539,230 | 9/1985 | Shimizu et al. | 427/230 |
| 4,549,968 | 10/1985 | Muccitelli | 210/750 |
| 4,595,519 | 6/1986 | Takeno et al. | 510/255 X |
| 4,617,251 | 10/1986 | Sizensky | 134/38 X |
| 4,626,411 | 12/1986 | Nemes et al. | 422/13 |
| 4,699,868 | 10/1987 | Sabongi | 430/264 |
| 4,732,887 | 5/1988 | Obanawa et al. | 502/402 |
| 4,737,195 | 4/1988 | Carandang et al. | 134/38 |
| 4,786,578 | 11/1988 | Neisius et al. | 430/256 |
| 4,824,763 | 4/1989 | Lee | 430/258 |
| 4,824,949 | 4/1989 | Lee | 430/258 |
| 4,834,912 | 5/1989 | Hodgens et al. | 134/2 X |
| 4,861,386 | 8/1989 | Hoy | 134/2 X |
| 4,873,136 | 10/1989 | Foust et al. | 428/209 |
| 4,895,703 | 1/1990 | Zupanovich et al. | 422/14 |
| 4,929,301 | 5/1990 | Beechko | 156/657 |
| 4,941,941 | 7/1990 | Austin et al. | 156/647 |
| 4,980,077 | 12/1990 | Morris et al. | 134/2 X |
| 5,015,298 | 5/1991 | Arrington | 134/2 X |
| 5,022,926 | 6/1991 | Kreh et al. | 134/2 |
| 5,049,201 | 9/1991 | Cheng et al. | 134/42 |
| 5,073,622 | 12/1991 | Wojtech et al. | 528/486 |
| 5,091,103 | 2/1992 | Dean et al. | 510/176 |
| 5,185,235 | 2/1993 | Sato et al. | 430/331 |
| 5,279,771 | 1/1994 | Lee | 252/548 |
| 5,288,332 | 2/1994 | Pastilnik et al. | 134/2 X |
| 5,290,361 | 3/1994 | Hayashida et al. | 134/2 X |
| 5,308,745 | 5/1994 | Schwartzkopf | 430/329 |
| 5,334,332 | 8/1994 | Lee | 252/548 |
| 5,407,788 | 4/1995 | Fang | 134/38 X |
| 5,419,779 | 5/1995 | Ward | 134/38 |

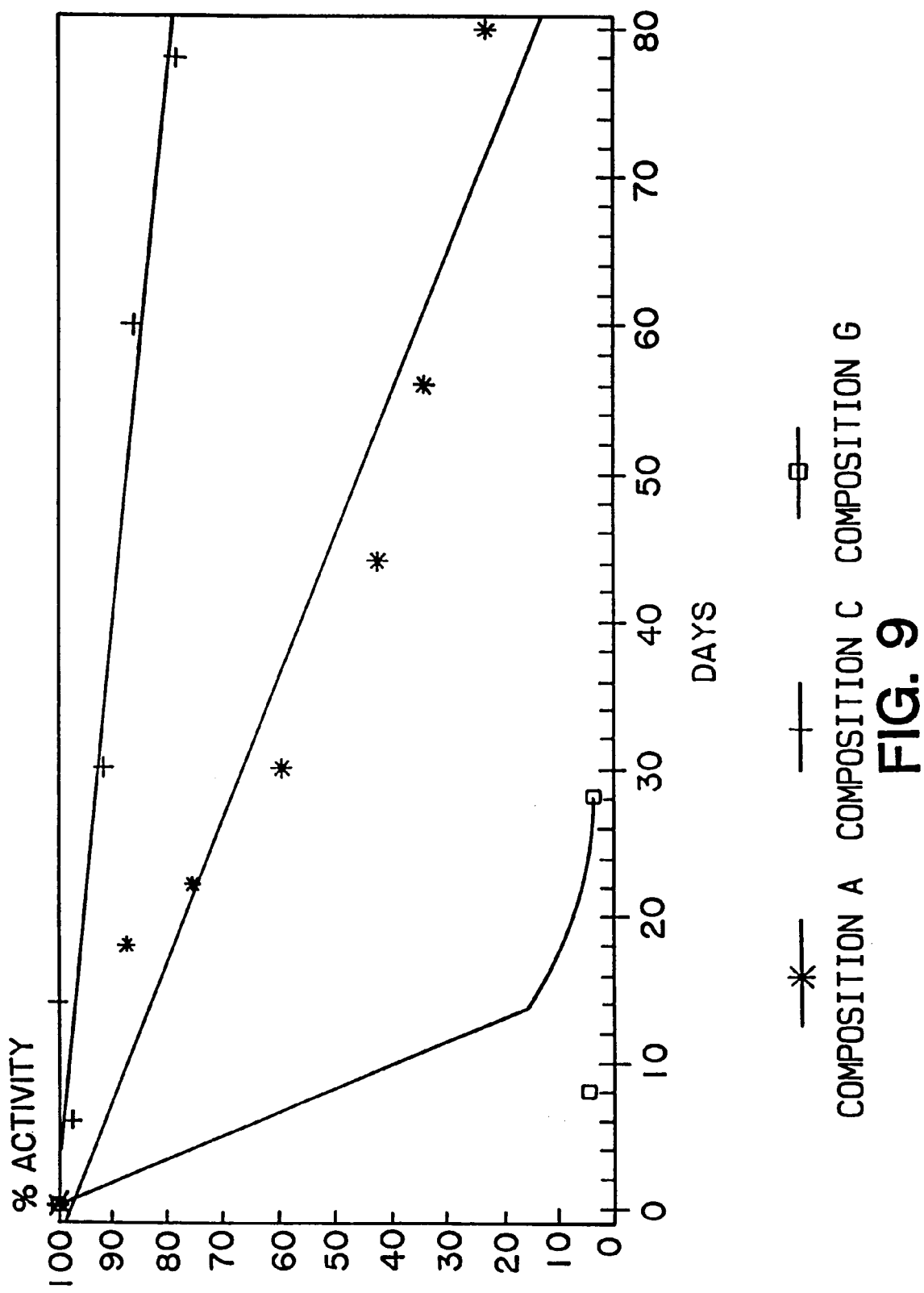

5,902,780

CLEANING COMPOSITIONS FOR REMOVING ETCHING RESIDUE AND METHOD OF USING

This is a division of application Ser. No. 08/523,889 filed Sep. 6, 1995 now U.S. Pat. No. 5,672,577 which is a continuation of application Ser. No. 08/273,143 filed Jul. 14, 1994 now U.S. Pat. No. 5,482,566, which is a division of Ser. No. 07/911,102 filed Jul. 9, 1992 now U.S. Pat. No. 5,334,332, which is a continuation-in-part of application Ser. No. 07/610,044 filed Nov. 5, 1990, now U.S. Pat. No. 5,279,771.

FIELD OF THE INVENTION

The present invention is directed to a stripping and cleaning composition comprising hydroxylamine and at least one alkanolamine for removing resists and etching residue from a substrate. One or more polar solvents can additionally be included in the composition when used as a stripper. No solvents are utilized when the composition is used as a cleaner. The cleaning composition preferably also includes a chelating agent. The stripping composition is especially suitable for removing a photoresist from a substrate during the manufacture of semiconductor integrated circuits and the removal of cured polymer coatings from a substrate, such as a polyimide coating, without damaging the substrate. The cleaning composition is useful for removing etching residue when a resist is removed from the substrate utilizing a composition or method other than the composition as disclosed in U.S. application Ser. No. 07/610,044 and herein.

BACKGROUND OF THE INVENTION

During the fabrication of microcircuits, the precise positioning of a number of appropriately doped regions on a slice of semiconductor is required followed by the positioning of one or more interconnection patterns on the semiconductor. Positive-type resists have been extensively used as masking materials to delineate patterns onto a substrate so that the patterns can be subsequently etched or otherwise defined into the substrate. The final step in preparing the substrate then involves removing the unexposed resist material from the substrate. Increasingly, however, plasma etching, reactive ion etching or ion milling is used to define the pattern in a substrate which renders the resist mask substantially impossible to remove by stripping agents containing one or more of the following solvents: halogenated hydrocarbons such as, for example, methylene chloride or tetrachloroethylene; amines and their derivatives such as, for example, dimethylformamide, dimethylacetamide, pyrrolidone, diethanolamine, and triethanolamine; glycol ethers, such as, for example, ethylene glycol monoethyl ether, 2-butoxyethanol, and 2-(butoxyethoxy)ethanol; and alkylsulfone, such as, for example, dimethylsulfone.

Additionally, during such etching processing, an organometallic by-product compound is formed as a sidewall polymeric material. The above-mentioned solvents are also ineffective in removing this sidewall organometallic polymer. A recently developed technique effective for photoresist removal is plasma oxidation, also known as plasma ashing. However, while this process is effective for removing a photoresist, it is not effective for removing the sidewall organometallic polymer formed during the etching process.

Further, polyimides are increasingly used in microelectronics as fabrication aids, passivants, and inter-level insulators. The use of a polyimide as a fabrication aid includes application of the polyimide as a photoresist, planarization layer in a multi-level photoresist scheme and as an ion implant mask. In these applications, the polymer is applied to a wafer or substrate, subsequently cured or patterned by a suitable method and removed after use. Many conventional strippers are not sufficiently effective in removing the polyimide layer once the polyimide has been subjected to a severe curing operation. The removal of such polyimides is normally accomplished by boiling the substrate in hydrazine or in an oxygen plasma.

Accordingly, a composition suitable for stripping a resist so as to remove the resist and the sidewall organometallic polymer would provide substantial advantages over conventional strippers.

Further, in the event a composition which is incapable of removing both the resist and the formed by-products is not utilized, such as conventional plasma oxidation, a composition which is capable of removing such etching residue is required and advantageous. If etching residue is not removed from the substrate, the residue can interfere with subsequent processes involving the substrate.

The demand for new wafer cleaning technology for use after etching and resist removal in particular increases as the industry enters into submicron processing techniques. The requirement for a cleaning solution to remove all types of residue generated as a result of plasma etching of various types of metals, such as aluminum, aluminum/silicon/copper, titanium, titanium nitride, titanium/tungsten, tungsten, silicon oxide, polysilicon crystal, etc., presents a need for more effective chemistry in the processing area.

More specifically, during the fabrication of microcircuits, the substrate surface can be aluminum, titanium, silicon oxide or polysilicon and patterns are delineated thereon by chemical etching. Increasingly, plasma etching, reactive ion etching or ion milling are used, and such etching processes produce undesirable by-products from the interaction of the plasma gases, reacted species and the photoresist. The composition of such by-products is generally made up of the etched substrates, underlying substrate, photoresist and etching gases. The formation of such by-products is influenced by the type of etching equipment, process conditions and substrates utilized. These by-products are generally referred to as "sidewall polymer," "veil" or "fences" and cannot be removed completely by either oxygen plasma or conventional solvents, such as N-methyl-2-pyrrolidone, diethyleneglycolbutylether, dimethylacetamide or the like, which are conventionally used to remove resists. Examples of alkaline/solvent mixture types of photoresist strippers which are known for use in stripping applications include dimethylacetamide or dimethylformamide and alkanolamines as described in U.S. Pat. Nos. 4,770,713 and 4,403,029; 2-pyrrolidone, dialkylsulfone and alkanolamines as described in U.S. Pat. Nos. 4,428,871, 4,401,747, and 4,395,479; and 2-pyrrolidone and tetramethylammonium hydroxide as described in U.S. Pat. No. 4,744,834. Such stripping compositions, however, have only proven successful in cleaning "sidewall polymer" from the contact openings and metal line etching in simple microcircuit manufacturing involving a single layer of metal process when the metal structure involves mainly Al—Si or Al—Si—Cu and the "sidewall polymer" residue contains only an organometallic compound with aluminum. The cleaning mechanism involving such materials has been studied by EKC Technology, Inc. and Intel Corp., as presented at the K.T.I. Conference in 1989 in the presentation entitled "*Metal Corrosion in Wet Resist Stripping Process*," by P. L. Pai, C. H. Ting, W. M. Lee and R. Kuroda. Due to the corrosive nature of such strippers as described above, the "sidewall polymer" is removed either by attacking the organoaluminum compound or the metal surface itself and causing the "sidewall polymer" residue to be lifted off. Further, in addition to the use of the stripping composition, mechanical scrubbing, such as ultrasonic vibration, is required to achieve complete removal of the "sidewall polymer."

The most current submicron processing techniques utilized in the industry involves multi-levels of metal and multi-level interconnecting processes. Such processes usually incorporate metal materials including TiN, TiW, Ti, TiSi, W, WSi and the like. The use of such materials results in the generation of new organometallic material by-products during plasma etching, whether formed intentionally or unintentionally, which renders the cleaning incomplete when utilizing existing commercially available stripping and cleaning products. Such findings were described at the SPIE Symposium on Microlithography in 1991 in a presentation entitled "Plasma Etching and Reactive Ion Etching" by John W. Coburn. In particular, it has been found that the residue remaining on the substrate surface after removal of a resist by plasma ashing has changed from the organometallic to the corresponding oxide, such as $TiO_2$, which is chemically inert to mild alkaline strippers. The effect of such poor cleaning results in low device yield, low device reliability, and low device performance.

Therefore, conventional solvents used as stripping compositions are ineffective in removing sidewall organometallic and metal oxide residue which is present following use of the current technology to remove resists. Even plasma ashing, which has been found effective for removing photoresists, is not effective for removing the sidewall organometallic polymer formed during etching processes.

OBJECTS OF THE INVENTION

Accordingly, a primary object of the present invention is to provide a stripping and cleaning composition comprising hydroxylamine and at least one alkanolamine for removing a resist and etching residue from a substrate and a method of using the composition.

A further primary object of the present invention is to provide a stripping and cleaning composition for removing organometallic and metal oxide residue from a substrate, in particular residue formed during etching and resist removal processes involving the substrate, without adversely damaging the substrate surface or hindering subsequent operation or process steps involving the substrate.

A further primary object of the present invention is to provide a cleaning composition including hydroxylamine, at least one alkanolamine, at least one chelating agent, and water for removing organometallic and metal oxide residue from a substrate and a method of using the composition.

BRIEF DESCRIPTION OF THE INVENTION

The present invention is directed to a stripping and cleaning composition containing hydroxylamine and at least one alkanolamine which is miscible with the hydroxylamine. Further, when utilized as a stripping composition, the composition can optionally contain one or more polar solvents. The addition of a polar solvent strengthens the effectiveness of the stripping composition. The stripping compositions allow for the clean removal of a resist from a substrate.

The stripping compositions of the present invention are particularly suitable for removing a photoresist material from a substrate, in particular, during the manufacture of a semiconductor integrated circuit without adversely affecting or hindering subsequent manufacturing operation or process steps.

Further, the stripping compositions of the present invention are suitable for removing cured polymer resists from a substrate, such as a partially or fully cured polyimide coating, and for removing organometallic polymers formed on a substrate during plasma etching processes.

When a stripping composition other than as described above is utilized to remove a resist, however, polymeric and other by-products resulting from the etching processes are not removed. Accordingly, further cleaning of the substrate is required. In addition to the above described stripping and cleaning composition, the present invention is also directed to providing a cleaning composition including hydroxylamine, at least one alkanolamine which is miscible with the hydroxylamine, at least one chelating agent, and water. The addition of a chelating agent increases the stability and effectiveness of the cleaning composition, in particular, by making the composition capable of removing etching residue from substrates which contain metal elements other than aluminum such as titanium (Ti), tungsten (W), silicon (Si) and silicon oxide (SiO). The cleaning compositions of the invention allow for the clean removal of organometallic and metal oxide etching residue from a substrate surface following removal of the resist therefrom. The most preferred chelating agents are 1,2-dihydroxybenzene and derivatives thereof according to the formula

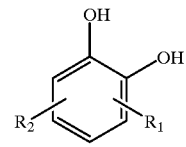

where $R_1$ and $R_2$ can be either H, t-butyl, OH, COOH or the like.

The cleaning compositions of the present invention are particularly suitable for removing organometallic and metal oxide residues from a substrate, in particular, during the fabrication of a submicron (i.e., less than 0.8 microns) integrated circuit without adversely affecting or hindering subsequent manufacturing operation or process steps involving the substrate. Further, the cleaning compositions of the invention are also effective in removing organometallic residue outgasing which has been deposited on parts of the etching equipment utilized in the processing. Such equipment can be made of polycarbonate, ceramic or aluminum.

The method of removing a resist or etching residue from a substrate using the compositions of the present invention involves contacting a substrate containing the resist or etching residue with the composition at a temperature and for a time sufficient to remove the particular resist or etching residue present.

DESCRIPTION OF THE DRAWING

FIGS. 7A–7D show the results of comparison tests using a cleaning composition of the present invention (FIGS. 7A and 7B) and a N-methyl-2-pyrrolidone solvent/alkanolamine base stripper (FIGS. 7C and 7D) in relation to openings on a silicon oxide dielectric layer. As shown in FIGS. 7A and 7B, all the organometallic residue was removed using the composition of the present invention while, as evident from FIGS. 7C and 7D, residue remained on the substrate treated with the stripper.

FIG. 9 illustrates the results of Example 15 below wherein the stability of cleaning Compositions L, N and R were compared.

DESCRIPTION OF THE PRESENTLY PREFERRED EMBODIMENT

Figure 1:
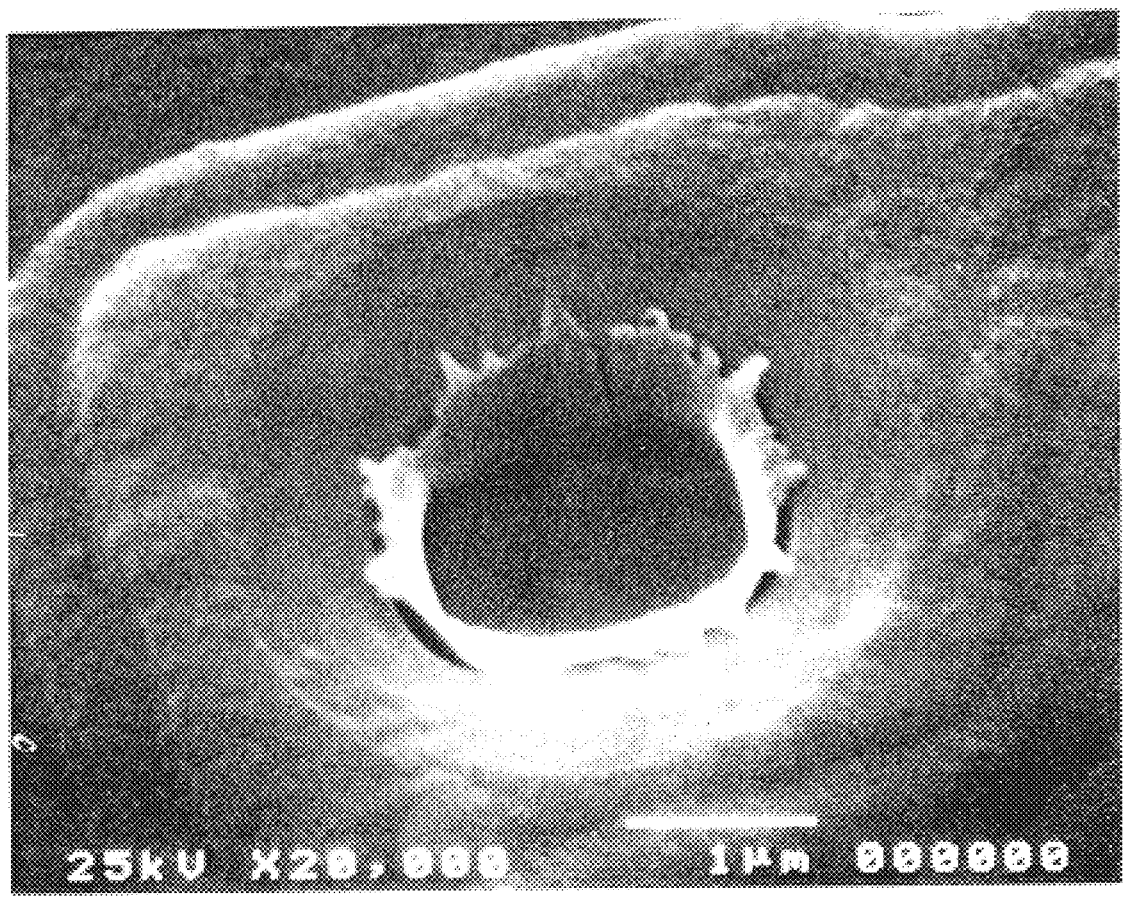
FIG. 1 shows etched wafer residue following the use of plasma ashing to remove a resist from a silicon oxide dielectric layer which had been earlier plasma etched.

The stripping composition of the present invention contains hydroxylamine, at least one alkanolamine, and, optionally, at least one polar solvent. The stripping compositions exhibit synergistic stripping properties suitable for removing resists, such as photoresists including those which have been treated in a plasma etching environment and cured polymer resists such as polyimide coatings. Additionally, the stripping compositions provide cleaning of the substrate by removing organometallic polymers formed on a substrate during plasma etching processes.

The stripping composition preferably contains at least about 5% by weight of hydroxylamine and at least about 10% by weight of at least one alkanolamine. Optionally, the stripping composition can also contain from about 5%–85% by weight of at least one polar solvent.

When a stripping composition as described above is not utilized to remove a resist from a substrate, organometallic polymer and metal oxide by-products formed in the etching and resist removal are not removed. Further, depending on the extent of the residue build-up, etching residue may remain when a non-aluminum based substrate is utilized. Accordingly, additional cleaning of the substrate is required. The present invention also provides a cleaning composition including hydroxylamine, at least one alkanolamine, at least one chelating compound, and water. The cleaning compositions of the present invention are free of organic solvents. The cleaning compositions are suitable for removing organometallic and metal oxide residue formed on a substrate, in particular residue formed during plasma etching processes. The substrate can include aluminum and non-aluminum metal elements such as titanium, tungsten, silicon and silicon oxide. The extent and type of residue remaining is determined by the etching equipment utilized, process conditions and substrates utilized.

The cleaning composition preferably includes from about 5% to 50% by weight of hydroxylamine, from about 10% to 80% by weight of at least one alkanolamine, from about 5%–30% by weight of at least one chelating agent, with the remaining balance of the composition being made up of water, preferably high purity deionized water.

The mechanism of the present invention for providing effective cleaning is believed to be on the basis that the organometallic compounds and metal oxides are reduced by the hydroxylamine and become more soluble in the water and alkanolamine solution. The presence of the chelating agents or ligands allows the metal ions to form soluble complexes in solution and not precipitate out from solution. The organometallic compound is represented as —(—O—$M^{+n}$—C—)— and the mechanism can be represented as follows:

$$NH_2OH + \text{—O—}M^{+n}\text{–C} \longrightarrow M^{n-1} + M^{n-2}$$

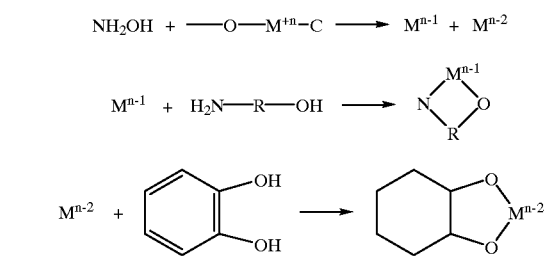

The hydroxylamine suitable for use in the present invention has the molecular structure $NH_2OH$. Hydroxylamine has properties which, in many ways, lie between those of amononia, $H_2N$—H, and water, H—OH, as its formula $H_2N$—OH might suggest. Hydroxylamine can also serve as a ligand for complexes as represented below.

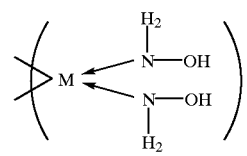

The alkanolamines suitable for use in the present invention are miscible with the hydroxylamine and are preferably water-soluble. Additionally, the alkanolamines useful in the present invention preferably have relatively high boiling points, such as for example 100° C. or above, and a high flash point, such as for example 45° C. or above. Suitable alkanolamines are primary, secondary or tertiary amines and are preferably monoamines, diamines or triamines, and, most preferably, monoamines. The alkanol group of the amines preferably has from 1 to 5 carbon atoms.

Preferred alkanolamines suitable for use in the present invention can be represented by the chemical formula $R_1R_2$—N—$CH_2CH_2$—O—$R_3$ wherein $R_1$ and $R_2$ can be H, $CH_3$, $CH_3CH_2$ or $CH_2CH_2OH$ and $R_3$ is $CH_2CH_2OH$.

Examples of suitable alkanolamines include monoethanolamine, diethanolamine, triethanolamine, tertiarybutyldiethanolamine isopropanolamine, 2-amino-1-propanol, 3-amino-1-propanol, isobutanolamine, 2-amino-2-ethoxyethanol, and 2-amino-2-ethoxy-propanol.

Polar solvents suitable for use in the stripping composition of the present invention include ethylene glycol, ethylene glycol alkyl ether, diethylene glycol alkyl ether, triethylene glycol alkyl ether, propylene glycol, propylene glycol alkyl ether, dipropylene glycol alkyl ether, tripropylene glycol alkyl ether, N-substituted pyrrolidone, ethylenediamine, and ethylenetriamine. Additional polar solvents as known in the art can also be used in the composition of the present invention.

Preferred chelating agents suitable for use in the cleaning composition of the present invention include 1,2-dihydroxybenzene and derivatives thereof according to the formula

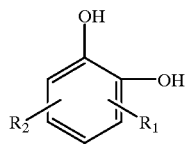

wherein $R_1$ and $R_2$ can be either H, t-butyl, OH, COOH or the like.

Additional chelating agents as known in the art may also be used in the composition of the present invention. For example, chelating agents which are metal ion free chelating agents may be utilized, such as thiophenol and its derivative according to the formula

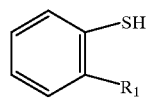

where $R_1$=OH or COOH; or ethylene diamine tetracarboxylic acid, of the formula

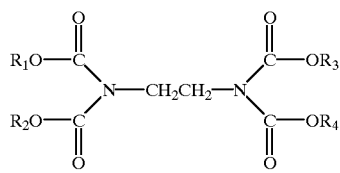

where $R_1$, $R_2$, $R_3$ and $R_4$ can be either H or $NH_4$, and its ammonium salt. Sodium, potassium or the like salts would not therefore be suitable for use based upon the understood mechanism of ionic contamination in a microcircuit as caused by cleaning and set forth above. As evident from the above formula, the carboxylic acid may be mono-, di- or tri-substituted rather than tetra-substituted.

A preferred cleaning composition of the present invention includes 30% by weight hydroxylamine, 25% by weight 2-amino-2-ethoxyethanol, 5% by weight 1,2-dihydroxybenzene and 50% by weight of water.

The stripping compositions of the present composition are effective in removing a wide range of positive photoresists but are particularly useful in removing photoresists commonly consisting of an ortho-naphthoquinone diazide sulfonic acid ester or amide sensitizer with novolak-type binders or resins. Examples of commercially available photoresist compositions which the stripping compositions of the present invention effectively remove from a substrate include K.T.I. photoresists 820, 825; Philip A. Hunt Chemical Corp. Waycoat HPR 104, HPR 106, HPR 204 and HPR 206 photoresists; Shipley Company, Inc. photoresists of the AZ-1300 series, AZ-1400 series and AZ-2400 series; and Tokyo Ohka Kogyo Co., Ltd. photoresist OFPR-800.

Further, the stripping compositions of the present invention are effective in removing polyimide coatings from substrates even when the polyimide coatings have been subjected to a high temperature cure, including a cure performed at a temperature as high as about 400° C. Examples of commercially available polyimide compositions which the stripping compositions of the present invention effectively remove from a substrate includes Ciba Geigy Proimide 293, Asahi G-6246-S, and DuPont PI2545 and PI2555.

Examples of substrates from which the stripping and cleaning compositions of the present invention remove photoresists without attacking the substrates themselves include metal substrates such as aluminum, titanium/tungsten, aluminum/silicon, aluminum/silicon/copper; and substrates such as silicon oxide, silicon nitride, and gallium/arsenide; and plastic substrates such as polycarbonate.

The cleaning compositions of the present invention are also effective in removing organometallic and metal oxide residue generated on the substrate of the etching equipment utilized. Examples of commercially available etching equipment include Lam Research, Tegal, Electrotech, Applied Material, Tokyo Electron, Hitachi and the like.

The method of removing a resist or other material from a substrate using the stripping compositions of the present invention involves contacting a substrate having a resist thereon with a stripping composition of the present invention for a time and at a temperature sufficient to remove the resist. The time and temperature are determined based on the particular material being removed from a substrate. Generally, the temperature is in the range of from about 50° C. to 150° C. and the contact time is from about 2 to 30 minutes.

The method of cleaning a substrate using the cleaning compositions of the present invention involves contacting a substrate having organometallic and metal oxide residue thereon with a cleaning composition of the present invention for a time and at a temperature sufficient to remove the residue. The substrate is generally immersed in the cleaning composition. The time and temperature are determined based on the particular material being removed from a substrate. Generally, the temperature is in the range of from about ambient or room temperature to 100° C. and the contact time is from about 2 to 60 minutes.

Examples illustrating the removal of a resist from a substrate under varying conditions using the stripping compositions of the present invention are described further below. Thereafter, examples illustrating the removal of etching residue from a substrate are set forth. The following examples are provided to further illustrate the present invention and are not intended to limit the scope of the present invention.

Examples of stripping compositions according to the present invention suitable for removing a resist from a substrate are set forth in Table I below.

TABLE I

| Stripping Composition | Hydroxylamine Wt. % | Alkanolamine Wt. % | Solvent Wt. % |
|---|---|---|---|
| A | 10% | 90% 2-Ethoxy-2-Amino Ethanol | 0% |
| B | 50% | 50% 2-Ethoxy-2-Amino Ethanol | 0% |
| C | 10% | 45% 2-Ethoxy-2-Amino Ethanol | 45% N-Methyl-2-Pyrrolidone |
| D | 10% | 45% Diethanomamine | 45% N-Methyl-2-Pyrrolidone |
| E | 50% | 50% Diethanolamine | 0% |
| F | 20% | 30% Diethanolamine | 50% Dipropyleneglygol Ethyl Ether |
| G | 35% | 35% Diethanolamine | 30% Diethyleneglycol Butyl Ether |
| H | 35% | 50% 2-Ethoxy-2-Amino Ethanol | 15% Triethyleneglycol Butyl Ether |
| I | 25% | 25% Tertiary Butyldiethanolamine | 50% N-Methyl-2-Pyrrolidone |
| J | 50% | 25% 2-Ethoxy-2-Amino Ethanol | 25% Diethylenetriamine |
| K | 25% | 50% 2-Ethoxy-2-Amino Ethanol | 25% Diethylenetriamine |

EXAMPLE 1

Example 1 illustrates the removal of a photoresist from a substrate using different stripping compositions of the present invention. The substrate is treated in a conventional manner prior to the treatment of the substrate with the stripping compositions of the present invention.

More specifically, wafer substrates were spun in a commercially available spinning apparatus with the photoresist K.T.I. 820 at spinning speeds ranging from 1000 to 5000 RPM resulting in the formation of films having a thickness of about 0.5–2.5 microns on the substrate. After thus coating the substrate, the substrate was heated for about 10–20 minutes at 80° C.–90° C. to drive out any traces of solvent from the photoresist. Next, the photoresist was selectively exposed using an image pattern transfer technique as known in the art. The exposed areas of the positive photoresist were solubilized in a developer solution. After such development, the pattern on the wafer was cleaned using a spray rinse and the wafer hard-baked. Baking temperatures can be in the range of from about 125° C.–200° C. Baking causes the resist to harden and adhere firmly to the surface of the substrate. The final step in the wafer preparation process is the removal of the unexposed positive photoresist material. Removal of this material is performed using stripping compositions of the present invention. Stripping baths were prepared and maintained at a constant temperature in 1000 ml beakers. The hard-baked coated wafers were immersed in the stripping composition contained in the beakers. The contents of the beakers were subjected to intermittent agitation for specified times. After the wafer was removed from the stripping bath, the wafer was rinsed in a cascade of deionized water and spun dry in a spin/rinser dryer. The effectiveness of the stripping operation was judged by the time required for removal of the coating layer and the amount of photoresist residue remaining on the wafer surface following rinsing. Specific examples performed as described above utilizing stripping compositions as set forth in Table I are set forth in Table II below.

TABLE II

| Resist Hard Bake Temp. | Stripping Composition | Bath Temp. | Bath Time (Mins) | Observations |
|---|---|---|---|---|
| 125° C. | A | 65° C. | 10 | Resist dissolved in 3 minutes; Rinsed very cleanly |
| 150° C. | A | 65° C. | 5 | Resist lifted very cleanly from substrate |
| 180° C. | B | 65° C. | 10 | Resist dissolved in 2 minutes; Rinsed clean |
| 150° C. | D | 75° C. | 5 | Resist dissolved in 3 minutes; Rinsed clean |

EXAMPLE 2

Example 2 illustrates the removal of a polyimide resist coating from a substrate using stripping compositions of the present invention. As in Example 1, a conventional coating method was utilized.

More specifically, wafer substrates were coated with Asahi G-6246-S negative imageable polyimide to a thickness of 16 microns. The coated wafers were baked at 250° C. to remove the solvent present in the polyimide. The polyimide coating was then exposed in a Nikon Stepper with a 350 mJ dose and developed in the Asahi A-145/C-210 developer. The wafers were then immersed in a bath containing a stripping composition and processed in the stripping bath as described in Example 1 according to the temperatures and times as set forth in Table III below.

TABLE III

| Stripping Composition | Bath Temp. | Bath Time (Min) | Observations |
|---|---|---|---|
| B | 70° C. | 10 | Polyimide dissolved; Rinsed cleanly |
| C | 65° C. | 10 | Polyimide dissolved; Rinsed cleanly |
| E | 75° C. | 10 | Polyimide dissolved after 2 minutes; Rinsed very cleanly |
| I | 65° C. | 10 | Polyimide dissolved; Rinsed very cleanly |

EXAMPLE 3

Example 3 illustrates the removal of a polyimide coating from a substrate having multiple layers of materials thereon.

A coating of Ciba Geigy Proimide 293 was spun onto a 3" Gallium/Arsenide wafer to a thickness of 4 microns. The polyimide coating was fully cured at 400° C. for 30 minutes. Silicon oxide was then deposited to a thickness of 1000 Angstrom on the polyimide coated surface. Thereafter, a positive photoresist was applied over the silox surface and a pattern created in the photoresist through the steps of exposure and resist development. The image created was then transferred from the photoresist to the silox surface by etching the silicon oxide using a plasma etching technique as known in the art. The pattern was further transferred to the polyimide layer by etching the photoresist and polyimide simultaneously. This procedure resulted in a pattern which covered all the regions on which no metal film was desired. Thereafter, a titanium/tungsten metal film was deposited over the substrate-polyimide combination. Thus, the metal film contacted the substrate only in those regions where the metal film was required. Finally, the polyimide was removed from the substrate by immersing the treated wafer in a stripping composition of the present invention. The metal film as present in the substrate was not attacked by the stripping composition and the polyimide dissolved and rinsed clearly away from the substrate.

EXAMPLE 4

Example 4 illustrates the degree of metal corrosion present to a metal film when the stripping compositions of the present invention contact such metal film coated substrate for varying time periods.

Aluminum was sputtered onto silicon wafers to a thickness of 6000 Angstroms. The sheet resistance of the metal film on the wafers was measured using a Prometrix VP-10 four point probe prior to treating the wafer with a stripping composition. The wafers were then immersed in stripping composition B or stripping composition C as described in Table I for 10, 15, and 20 minutes. Thereafter, the sheet resistance of the metal film was again measured. The amount of metal corrosion was based on the percentage of change in thickness present with respect to the metal film. The results are set forth in Tables IV and V below.

TABLE IV

STRIPPING COMPOSITION B

| Time (Min) | Rs Initial | Rs Final | Change In thickness |
|---|---|---|---|
| 20 | 47.74 | 48.39 | 1.34% |
| 15 | 47.86 | 48.33 | 0.97% |
| 10 | 47.71 | 47.85 | 0.29% |
| 0 | 38.39 | 38.39 | 0.00% |

TABLE V

STRIPPING COMPOSITION C

| Time (Min) | Rs Initial | Rs Final | Change in Thickness |
|---|---|---|---|
| 20 | 47.05 | 47.39 | 0.72% |
| 15 | 47.17 | 47.46 | 0.61% |
| 10 | 47.2 | 47.3 | 0.21% |
| 0 | 47.47 | 47.47 | 0.00% |

Varying examples illustrating the removal of etching residue from a substrate under varying conditions using the cleaning compositions of the present invention are set forth below.

Examples of cleaning compositions according to the present invention suitable for removing etching residue from a substrate are set forth in Table VI below.

TABLE VI

| Cleaning Composition | Hydroxylamine Wt. % | Alkanolamine Wt. % |
|---|---|---|
| L | 25% | 50% 2-Amino-2-Ethoxy Ethanol |
| M | 20% | 60% 2-Amino-2-Ethoxy Ethanol |
| N | 20% | 55% 2-Amino-2-Ethoxy Ethanol |
| O | 17.5% | 50% Monoethanolamine |
| P | 8.75% | 30% 2-Amino-2-Ethoxy Ethanol |
| Q | 15% | 60% Monoethanolamine |
| R | 15% | 70% 2-Amino-2-Ethoxy Ethanol |

| Cleaning Composition | Water Wt. % | 1,2-dihydroxybenzene Wt. % |
|---|---|---|
| L | 25% | 0% |
| M | 20% | 0% |
| N | 20% | 5% |
| O | 17.5% | 15% |
| P | 63.5% | 2.5% |
| Q | 20% | 5% |
| R | 15% | 0% |

EXAMPLE 5

Figure 2:
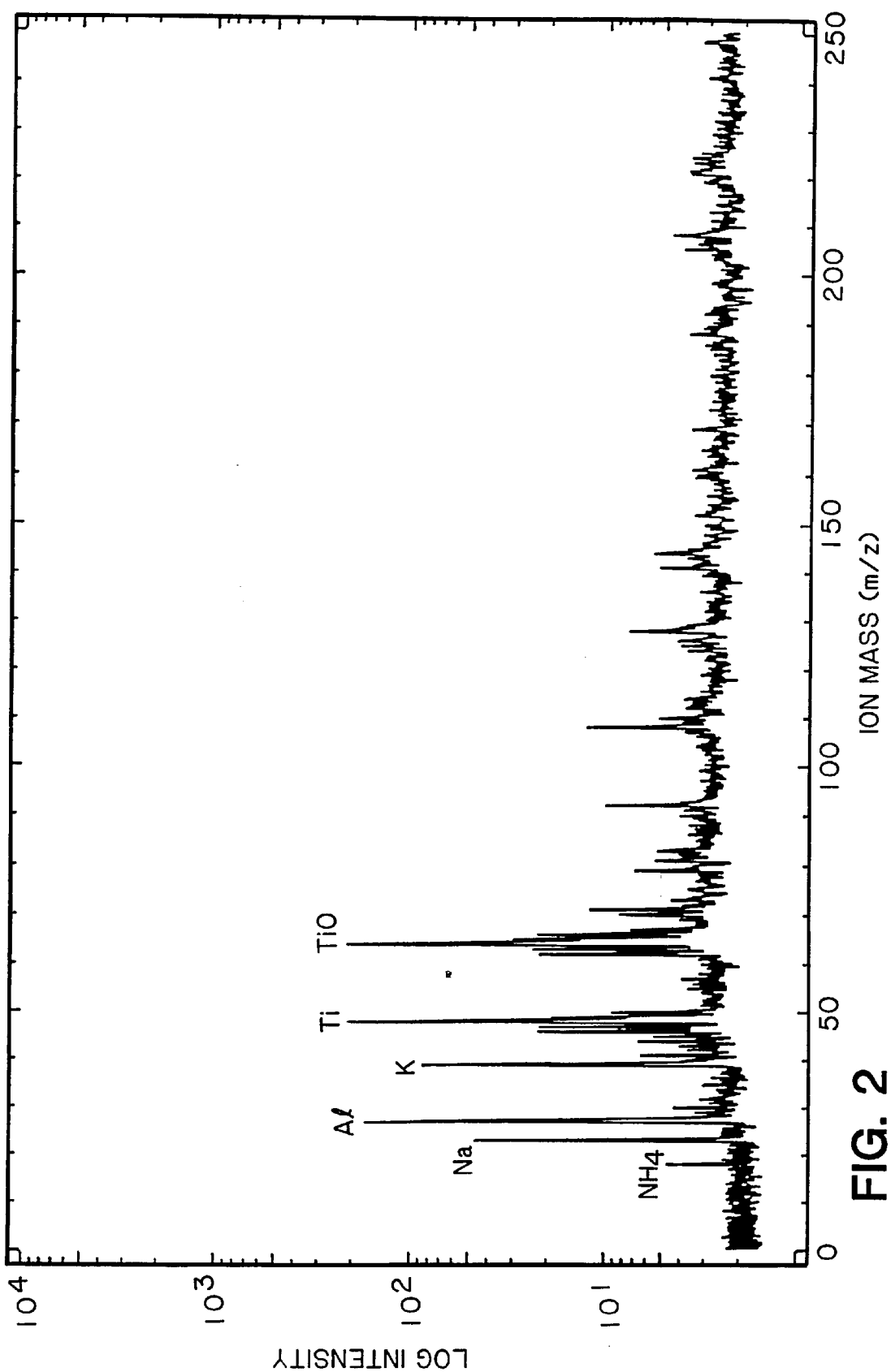
FIG. 2 shows the results of an analysis using ion mass spectrometry (LIMA) of the residue shown in FIG. 1. Such analysis indicates that the residue contains metal oxide and trace amounts of organic material.

Example 5 illustrates the problem of residue remaining on a wafer substrate following plasma etching and ashing. FIG. 1 shows etched wafer residue present on an etched substrate following plasma ashing. Specifically, silicon oxide used as a dielectric layer has a pattern etched for a multi-layer interconnect according to a standard plasma etching process. A photoresist which was used as a masking material has already been removed by oxygen plasma ashing. Analysis of the residue present on the etched wafer was analyzed by ion mass spectrometry (LIMA). The results of the analysis are as shown in FIG. 2. The analysis confirms that the residue contains metal oxide and trace amounts of organic material.

EXAMPLE 6

Example 6 illustrates the effect of the cleaning composition of the present invention on a wafer as determined by C/V testing. C/V shift measurement is a means utilized to determine the effect of a chemical used to clean a wafer. A high voltage shift is mainly caused by mobile ion contamination to the wafer. Such contamination will adversely affect subsequent process steps and may eventually cause failure of the microcircuits.

The test evaluation compares the C/V shift of different conventional photoresist stripping compositions to the cleaning composition of the present invention. All wafers used were known to be good silicon oxide substrates. All chemicals were heated on a hot plate to the manufacturers' suggested operating temperature using a pyrex beaker. Each of the beakers utilized was new and had not been previously used in any chemical processing. Individual beakers were used for each product. After immersing the silicon oxide wafer in the described composition, the wafers were rinsed and dried. Table VII sets forth the operating conditions and the results of the C/V shift test.

TABLE VII

| Composition Product | Manufacturer | U.S. Pat. No. | Process Conditions | Results |
| --- | --- | --- | --- | --- |
| PRS-3000 | J. T. Baker | 4,403,029 | 90° C./20 min. | +15.624 volts |
| EMT 300 | EMT | 4,770,713 | 90° C./20 min. | +2.440 volts |
| N-Methyl-2-Pyrrolidone | J. T. Baker | 4,395,479 | 90° C./20 min. | +2.044 volts |
| Nophenol 944 | EKC | 4,395,384 | 100° C./20 min. | −0.368 volts |
| Composition N | — | — | 65° C./20 min. | +0.221 volts |
| Control | — | — | — | −0.576 volts |

A negative reading means no change in C/V shift. The cleaning Composition N according to the present invention as described above was shown to provide a cleaner surface than any of the positive photoresist strippers tested.

EXAMPLE 7

Figure 3A:
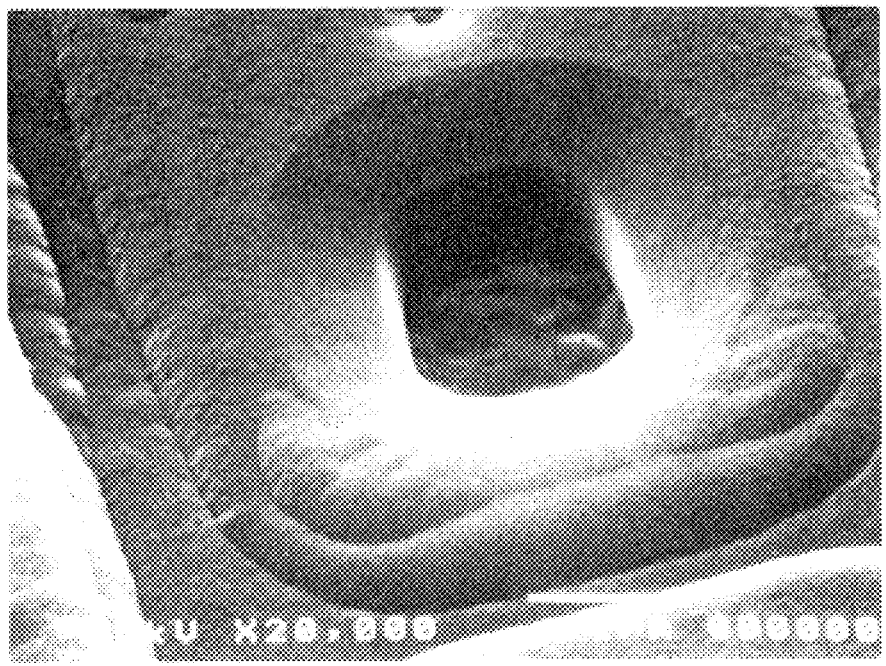
FIGS. 3A and 3B show the results of a comparison test utilizing a cleaning composition of the present invention (FIG. 3A) and a stripping composition as described in U.S. Pat. No. 4,403,029 (FIG. 3B) in relation to a silicon oxide dielectric layer containing etching residue thereon which is present following removal of a resist by plasma ashing. By comparing FIG. 3A with FIG. 3B, it can be seen that all the organometallic residue was removed using the composition of the present invention while residue remained following use of the stripping composition described in U.S. Pat. No. 4,403,029.
Figure 3B:
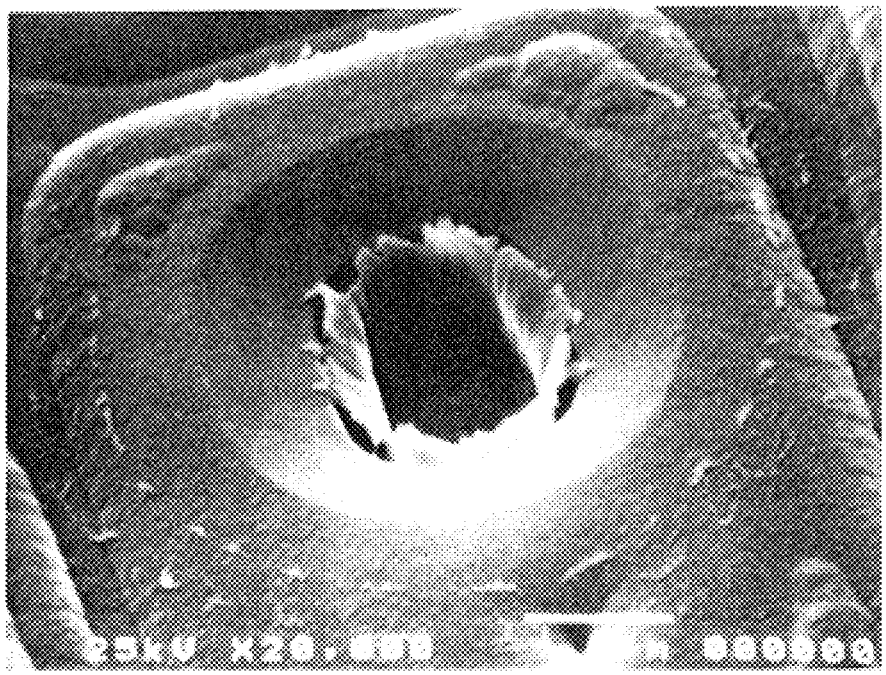

Example 7 illustrates the results of a comparison test between Composition Q of the present invention as described above and the stripping composition described in U.S. Pat. No. 4,403,029 and sold under the name PRS-2000 by J. T. Baker. The results of the comparison test are shown with respect to an opening having the size of 1.2 micron in FIGS. 3A and 3B. Each opening was present on a silicon oxide dielectric layer which was etched using a standard silicon oxide plasma etching process. The photoresist was removed from the layer following etching by oxygen plasma ashing. The substrate was then processed by immersing the substrate in Composition Q as described above for 10 minutes at 65° C. A micrograph from a scanning microscope as shown in FIG. 3A indicates that Composition Q removed all the organometallic residue. As shown in FIG. 3B, residue remained on the substrate when an etched wafer prepared under the same process conditions was processed by immersion in PRS-2000 for 10 minutes at 65° C.

EXAMPLE 8

Example 8 illustrates the results of a comparison test between Composition N as described above and a stripping composition as described in U.S. Pat. No. 4,770,713 and sold under the name ACT-150I. ACT-150I is a dimethylacetamide solvent based photoresist stripper.

Figure 4A:
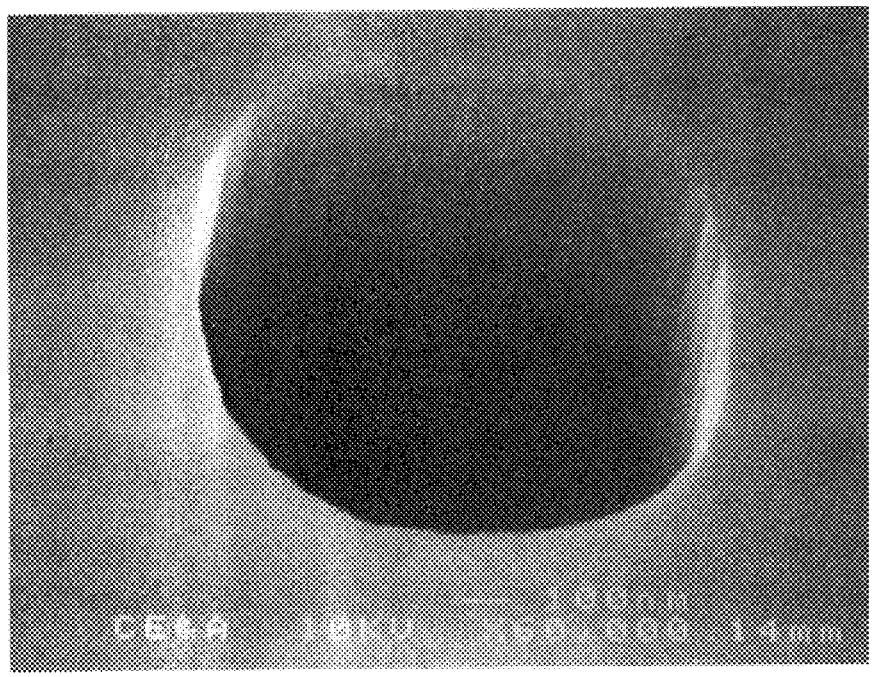
FIGS. 4A and 4B show the results of a comparison test utilizing a cleaning composition of the present invention (FIG. 4A) and a stripping composition as described in U.S. Pat. No. 4,770,713 (FIG. 4B) in relation to a silicon dielectric layer which contained etching residue following removal of a resist therefrom by plasma ashing. As evident upon a comparison of FIG. 4A with FIG. 4B, the composition of the present invention removed all the organometallic residue while the other composition did not.
Figure 4B:
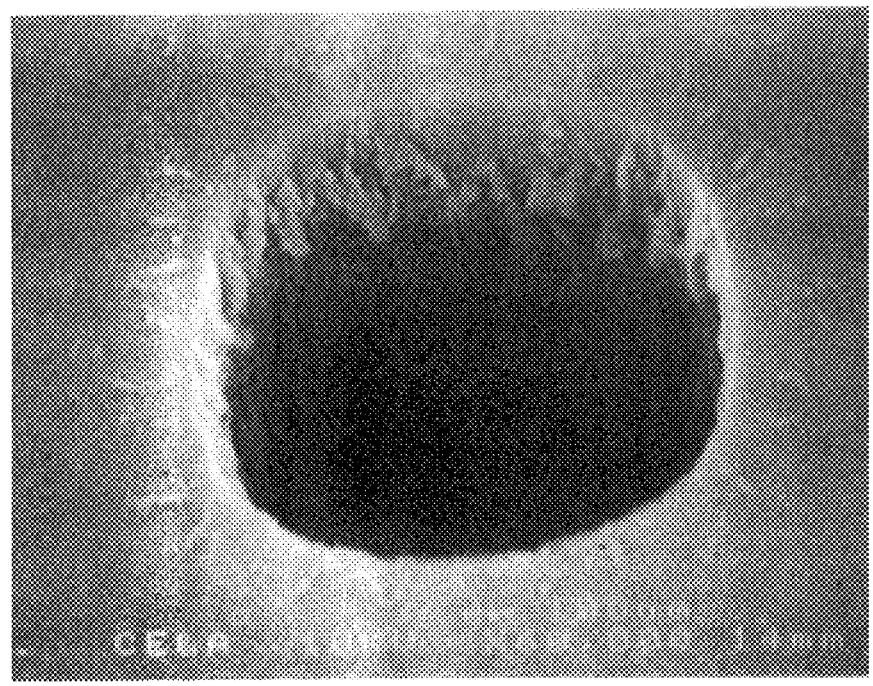

The comparison test results are shown in FIGS. 4A AND 4B with respect to openings having a size of 1.0 micron. Each opening was present on a silicon oxide dielectric layer which was etched using a standard silicon oxide plasma etching process. The photoresist was removed by oxygen plasma ashing. The substrate was then processed by immersion in Composition N as described above for 30 minutes at 45° C. A micrograph from a scanning electron microscope as shown in FIG. 4A shows that Composition N completely removed all the organometallic residue without damaging the silicon oxide substrate. FIG. 4B shows a substrate prepared under the same process conditions after immersion in ACT-150I for 30 minutes at 45° C. As shown in FIG. 4B, the stripping composition only partially removed the etching residue.

EXAMPLE 9

Figure 5A:
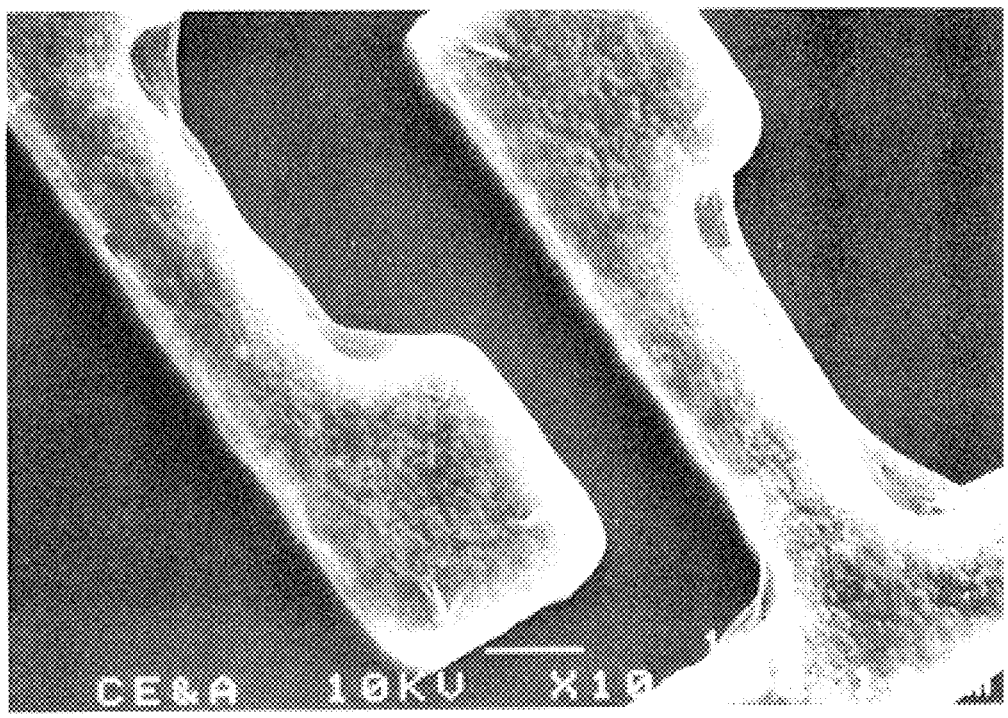
FIG. 5A shows a microcircuit pattern of polysilicon over silicon oxide containing etching residue which remained on the substrate following plasma etching.
Figure 5B:
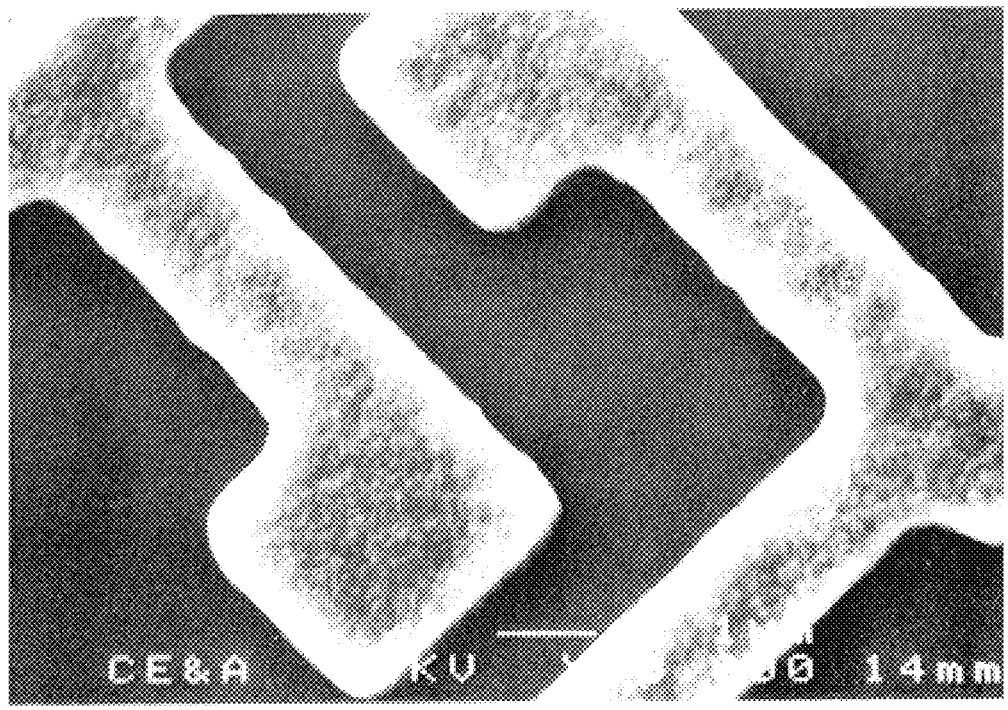
FIG. 5B shows the same microcircuit pattern following cleaning with a composition of the present invention. As evident from a comparison of FIG. 5A with FIG. 5B, it can be seen that the residue has been removed.

Example 9 illustrates the cleaning of polysilicon etching residue. A microcircuit pattern of polysilicon over silicon oxide was etched in plasma etching equipment using HBr as an etching gas. The photoresist was removed by oxygen plasma ashing. The etching residue, which is mostly Si—C—Br, is shown in FIG. 5A to remain on the polysilicon circuit line following the removal of the photoresist. When the wafer was further processed by immersion in Composition N of the present invention at 65° C. for 20 minutes, all of the etching residue was removed from the substrate as shown in FIG. 5B.

EXAMPLE 10

Figure 6A:
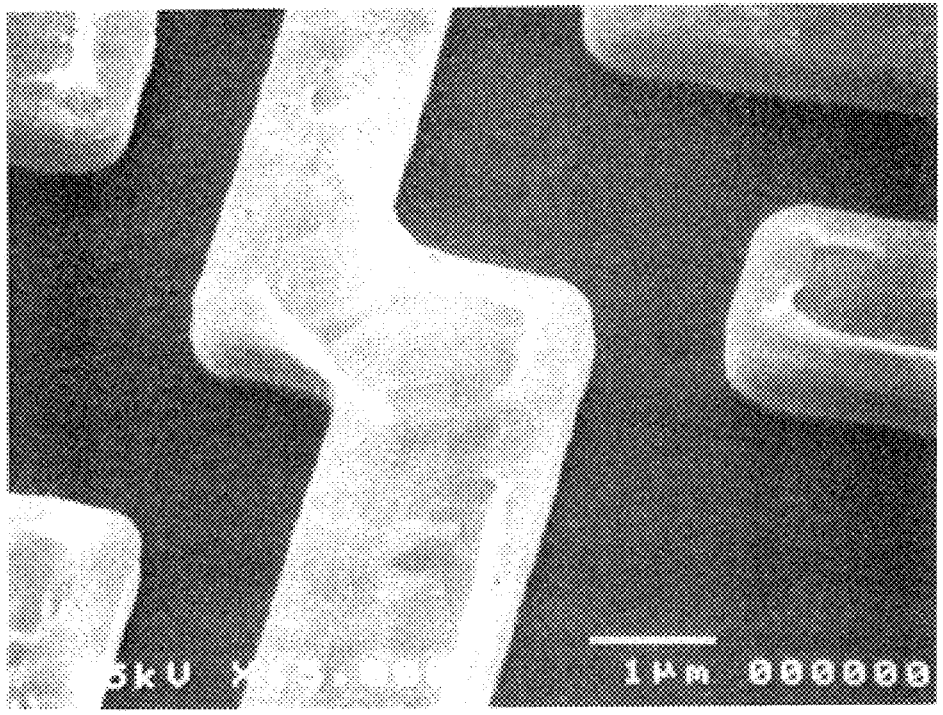
FIG. 6A shows residue which remained on a metal substrate after the removal of a photoresist from the substrate by plasma ashing.
Figure 6B:
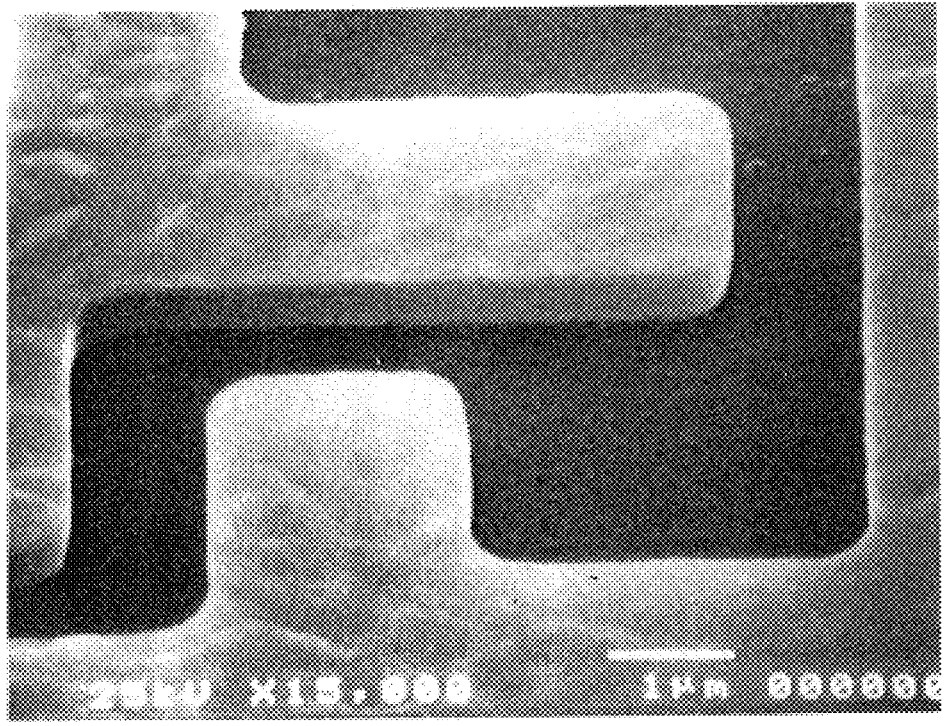
FIG. 6B shows the same substrate following cleaning with a composition of the present invention.

Example 10 illustrates the cleaning of a metal etch residue from a substrate. A sandwich metal substrate of TiW/Al—Si—Cu/TiW was patterned and etched in a plasma metal etcher, i.e., Applied Material 8330 Metal Etcher. Such metal etcher is a batch etching equipment and therefore is capable of treating more than one wafer at a time. Due to the manner of etching performed by such etching equipment, a lesser amount of "polymer" residue is built-up during etching. Since a lower degree of polymer residue is present, a cleaning composition without a chelating agent is sufficient to remove the etching residue. As shown in FIG. 6A, residue remained on the metal line after the photoresist was removed by oxygen plasma ashing. The wafer was then processed by immersion in Composition M as described above at 65° C. for 30 minutes. As shown in FIG. 6B, Composition M served to remove all the organometallic residue from the surface.

EXAMPLE 11

Figure 7A:
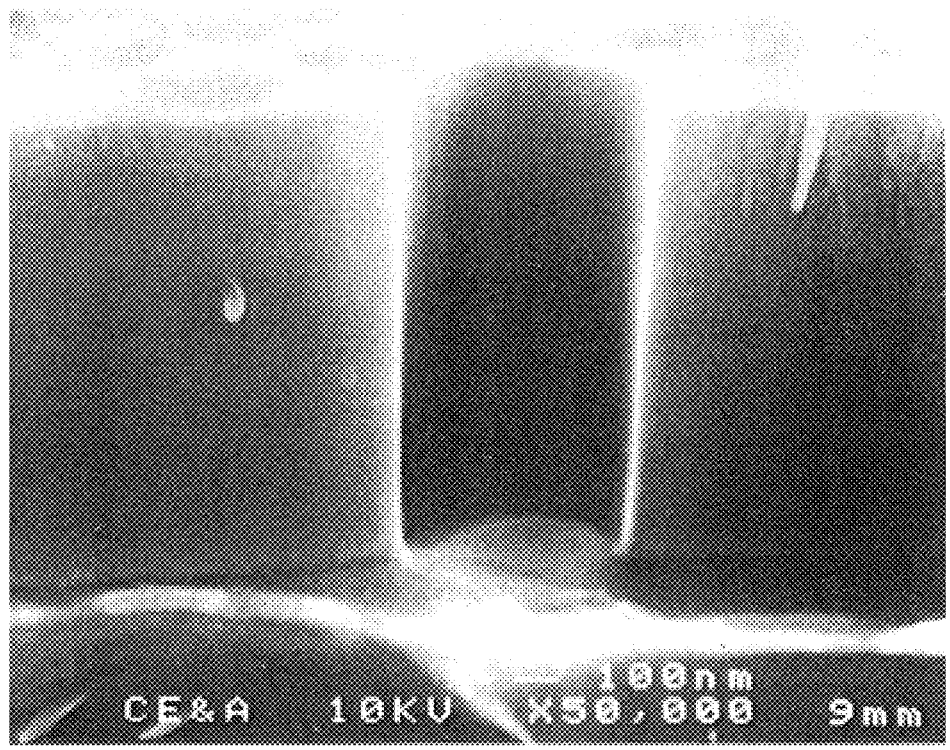
Figure 7B:
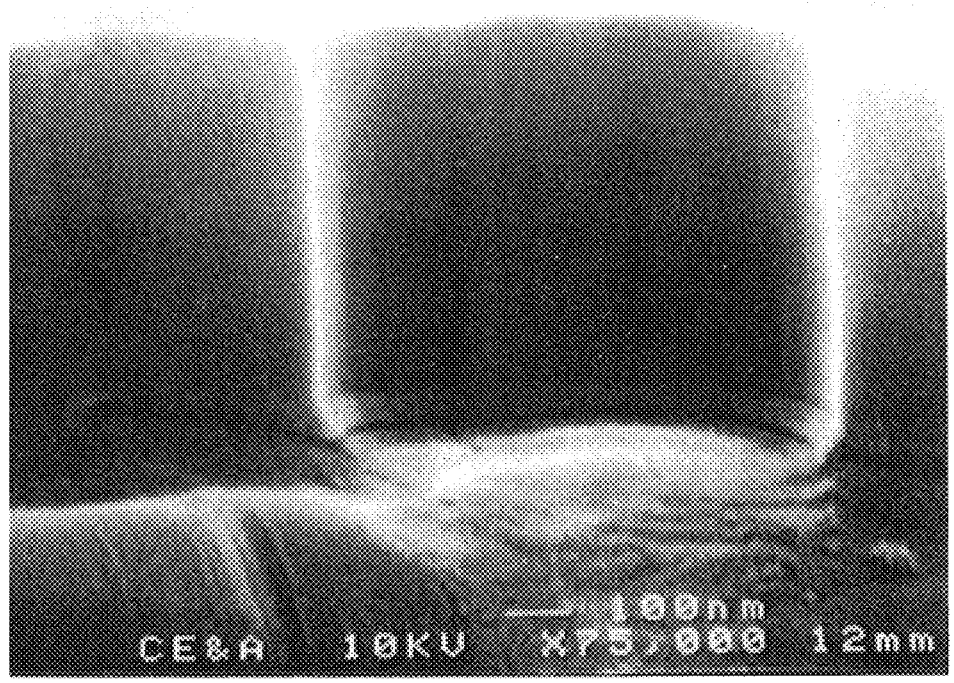

Example 11 illustrates the cleaning of a submicron circuit by means of via opening having a size of 0.6 microns on a silicon oxide dielectric layer which had been etched using a standard silicon oxide plasma etching processing. In particular, an oxide etcher as sold by Lam Research was utilized. In this process, the etching residue is mostly silicon containing polymer with a small ratio of metal in the composition. Accordingly, a cleaning composition of the invention not containing a chelating agent is capable of removing the residue. The underlying layer was a metal substrate of TiN/Al—Si—Cu The photoresist masking material was removed by oxygen plasma ashing. The substrate was then processed by immersion in Composition L as described above for 30 minutes at 60° C. A cross-section micrograph from a scanning microscope as shown in FIG. 7A indicates that Composition L removed all the organometallic residue. As shown in FIG. 7B, however, residue remained inside the opening when an etched wafer processed in the same conditions was treated in N-methyl-2-pyrrolidone solvent/alkanolamine based stripper for 60 minutes at 90° C. in an ultrasonic bath.

EXAMPLE 12

Portions of silicon oxide etching equipment which are made of heavy gauge aluminum were removed from the etching equipment for cleaning. The conventional procedure utilized to remove the deposited outgas residue on the etching equipment is by sandblasting. Sandblasting, however, is a time consuming procedure. It has been found that the residue deposited on the aluminum portion of the etching equipment can be easily removed by immersion in a composition of the present invention. An aluminum portion of etching equipment was immersed in Composition P for 30 minutes at 40° C. Following rinsing and drying, it was observed that the residue was removed.

EXAMPLE 13

The conventional process of cleaning a ceramic ring which forms a part of metal etching equipment involves either sandblasting or scrubbing by hand. Composition L was utilized to clean such ceramic ring by immersing the ceramic ring in an ultrasonic bath for 45 minutes at 35° C. It was found that the deposits on the ceramic ring were completely removed.

EXAMPLE 14

Figure 8A:
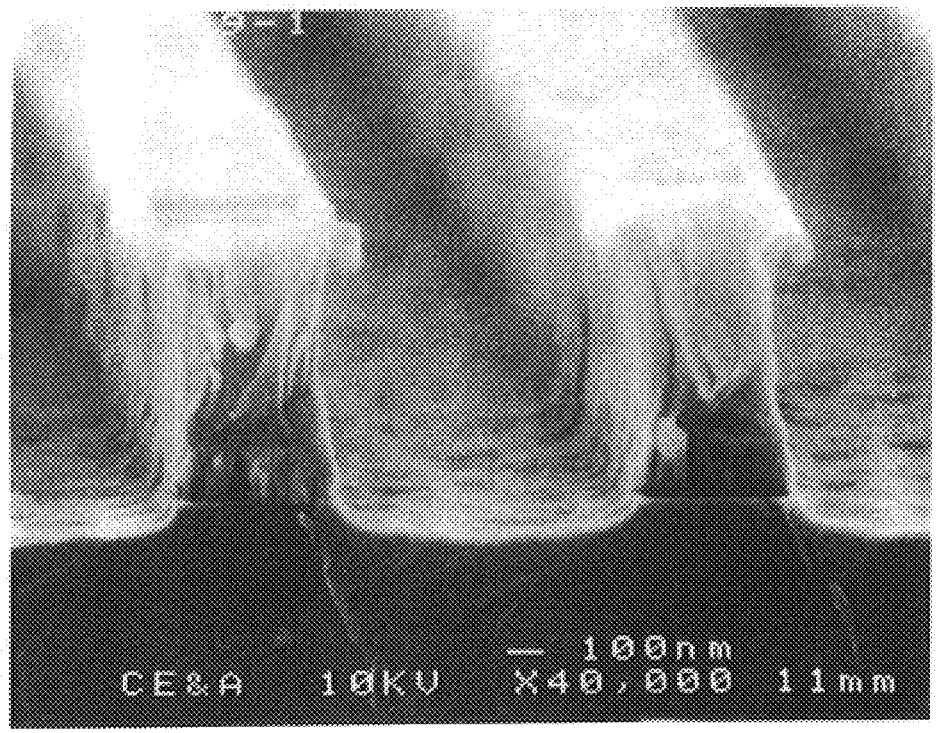
FIG. 8A shows residue remaining on a wafer following etching and the removal of a photoresist therefrom.
Figure 8B:
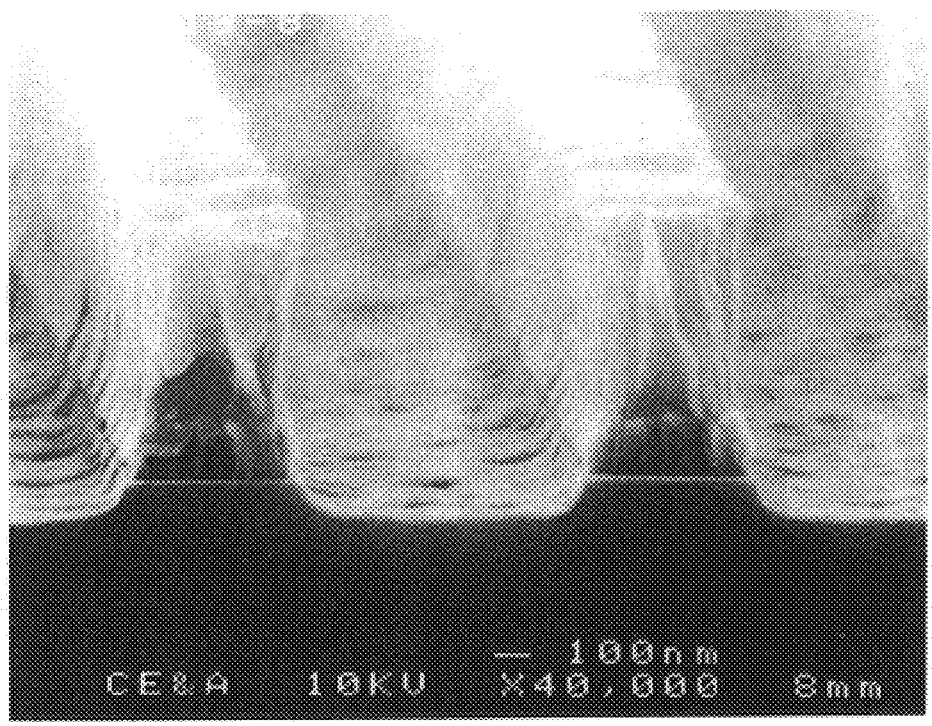
FIG. 8B shows the same wafer following cleaning with a composition of the present invention. All the residue on the wafer was removed.

Example 14 illustrates the cleaning of metal etch residue. An Al—Si—Cu/W/TiW metal pattern sitting on a plasma enhanced TEOS was utilized. The wafer had 50% overetching. P-5000 as sold by Applied Material was used for the metal etching. The P-5000 is a single wafer etcher and due to the processing technique of the etching equipment, a higher build-up of polymer remains following the etching which is more difficult to remove than that described in Examples 10 and 11 above. A sandwich metal substrate of Al—Si—Cu/W/TiW was patterned and etched in the plasma metal etcher P-5000. The small amount of residue left on the corner of the metal line after the photoresist was removed by oxygen plasma ashing and was cleaned using Composition M at 65° C. for 30 minutes. Such cleaned substrate is shown in FIG. 8A. Composition M did not provide for complete removal of the residue. A similar etched wafer was then processed by immersion in Composition O as described above at 65° C. for 30 minutes. As shown in FIG. 8B, Composition O removed all the organometallic residue from the surface. Composition M does not contain a chelating agent and Composition O contains a chelating agent.

EXAMPLE 15

Example 15 illustrates that cleaning solutions containing chelating agents have increased stability as compared to the cleaning solutions not containing such chelating agents. Compositions L, N and R, as described above, were each placed in separate sealed Pyrex flasks and maintained at room temperature for a period of 80 days. A sample was taken from each flask at regular intervals and analyzed to determine its activity. The activity of the cleaning compositions is measured by the reduction potential of the hydroxylamine. It can be seen from FIG. 9 that Compositions R and L lost their activity much faster than Composition N.

As will be apparent to one skilled in the art, various modifications can be made within the scope of the aforesaid description. Such modifications being within the ability of one skilled in the art form a part of the present invention and are embraced by the appended claims.

It is claimed:

1. A composition for cleaning etching residue from a substrate derived from a mixture of about 5–50% by weight hydroxylamine, about 10–80% by weight of an alkanolamine which is miscible with said hydroxylamine, and water, wherein the hydroxylamine and the alkanolamine are present in amounts sufficient to clean etching residue from the substrate.

2. A composition for removing etching residue from a substrate derived from a combination of about 5–50% by weight hydroxylamine; about 10–80% by weight of an alkanolamine which is miscible with said hydroxylamine; a compound selected from the group consisting of (1) a compound having a formula I as follows:

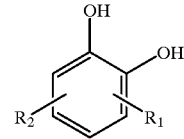

wherein $R_1$ and $R_2$ can be either H, t-butyl, OH, or COOH, (2) a compound having a formula II as follows:

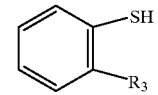

where $R_3$ is OH or COOH, and (3) an ethylene diamine tetracarboxylic acid having a formula III as follows:

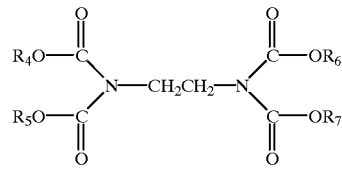

where $R_4$, $R_5$, $R_6$ and $R_7$ can be either H or $NH_4$, or an ammonium salt thereof; and water, wherein the hydroxylamine and alkanolamine are present in amounts sufficient to clean etching residue from the substrate.

3. The composition according to claim 2 wherein said compound is present in an effective amount of up to about 30% by weight.

4. The composition according to claim 1 or 2 wherein the alkanol group of said alkanolamine contains from 1 to 5 carbon atoms.

5. The composition according to claim 1 or 2 wherein said alkanolamine is selected from the group consisting essentially of monoamines, diamines, and triamines.

6. The composition according to claim 1 or 2 wherein said alkanolamine has a formula $R_1R_2$—N—$CH_2CH_2$—O—$CH_2CH_2OH$ wherein $R_1$ and $R_2$ can be H, $CH_3$, $CH_3CH_2$, or $CH_2CH_2OH$.

* * * * *